United States Patent
Monster et al.

(10) Patent No.: US 8,391,005 B2
(45) Date of Patent: Mar. 5, 2013

(54) FREQUENCY CONVERTER ON A MOTOR

(75) Inventors: Peter Monster, Randers (DK); Niels Hogholt Petersen, Bjerringbro (DK)

(73) Assignee: Grundfos Management a/s, Bjerringbro (DK)

( * ) Notice: Subject to any disclaimer, the term of this patent is extended or adjusted under 35 U.S.C. 154(b) by 254 days.

(21) Appl. No.: 12/936,708

(22) PCT Filed: Apr. 11, 2009

(86) PCT No.: PCT/EP2009/002705
§ 371 (c)(1),
(2), (4) Date: Oct. 7, 2010

(87) PCT Pub. No.: WO2009/127381
PCT Pub. Date: Oct. 22, 2009

(65) Prior Publication Data
US 2011/0026227 A1    Feb. 3, 2011

(30) Foreign Application Priority Data
Apr. 18, 2008    (EP) .................... 08007602

(51) Int. Cl.
*H05K 7/20*    (2006.01)
(52) U.S. Cl. .................. 361/690; 361/710; 361/715
(58) Field of Classification Search .................. 361/710, 361/715
See application file for complete search history.

(56) References Cited

U.S. PATENT DOCUMENTS

| | | | |
|---|---|---|---|
| 4,908,757 A * | 3/1990 | Jensen et al. ........... | 363/141 |
| 5,091,823 A * | 2/1992 | Kanbara et al. ........... | 361/697 |
| 5,650,914 A | 7/1997 | DiStefano et al. | |
| 5,714,816 A * | 2/1998 | Jensen et al. ........... | 310/89 |
| 6,229,232 B1 * | 5/2001 | Roth-Stielow et al. ... | 310/52 |
| 6,717,318 B1 | 4/2004 | Mathiassen | |
| 7,272,004 B2 * | 9/2007 | Hirota et al. ........... | 361/695 |
| 7,643,304 B2 * | 1/2010 | Hirota et al. ........... | 361/728 |
| 2005/0030715 A1 * | 2/2005 | Hirota et al. ........... | 361/695 |
| 2006/0087812 A1 * | 4/2006 | Meyer ........... | 361/688 |
| 2008/0137298 A1 * | 6/2008 | Meyer et al. ........... | 361/695 |
| 2010/0202109 A1 * | 8/2010 | Zheng et al. ........... | 361/697 |

FOREIGN PATENT DOCUMENTS

| | | |
|---|---|---|
| DE | 196 52 186 A1 | 6/1998 |
| DE | 10 2005 032968 A1 | 2/2007 |
| EP | 1 104 079 A2 | 5/2001 |

OTHER PUBLICATIONS

Int'l Search Report issued on Aug. 4, 2009 in Int'l Application No. PCT/EP2009/002705.

* cited by examiner

*Primary Examiner* — Gregory Thompson
(74) *Attorney, Agent, or Firm* — Panitch Schwarze Belisario & Nadel LLP (57) ABSTRACT

A frequency converter includes a housing, which is designed and envisaged for the peripheral assembly on an electric motor. The base of the housing is provided in the middle region on the outside with longitudinal ribs and is connected to heat-producing components of the power circuit of the frequency converter, is provided in outer regions with cooling ribs which are arranged on the outside transversely or obliquely to the longitudinal ribs, and on the inside is connected in a heat-conducting manner to heat-producing components of the input circuit and/or output circuit.

13 Claims, 5 Drawing Sheets

FREQUENCY CONVERTER ON A MOTOR

CROSS-REFERENCE TO RELATED APPLICATIONS

This application is a Section 371 of International Application No. PCT/EP2009/002705, filed Apr. 11, 2009, which was published in the German language on Oct. 22, 2009, under International Publication No. WO 2009/127381 A1 and the disclosure of which is incorporated herein by reference.

BACKGROUND OF THE INVENTION

The invention relates to a frequency converter for the assembly on an electric motor.

It is nowadays counted as belonging to the state of the art, to arrange a frequency converter or frequency transformer, as is applied with modern motors for the control of the rotation speed, in particular for achieving rotation speeds beyond the rotation speed which is physically inherent of the mains frequency, in a housing which is designed and envisaged for assembly on the electric motor, so that the frequency converter and the motor may be wired to one another in a fixed manner, and may be handled and installed together. The frequency converter housing thereby is typically designed in the manner of an enlarged terminal box and is arranged at a certain distance on the outer periphery of the motor. The frequency converter housing, in particular the lower housing part connected to the motor, is heat-conducting, typically of metal and designed in a ribbed manner, in order to lead away the heat which occurs particularly in the power circuit, but also in the remaining frequency converter. Thereby, it is counted as belonging to the state of the art, to arrange cooling ribs on the lower side of the frequency converter housing, which lie in the cooling air flow of the motor, said air flow being produced by a fan seated on one end of the motor shaft, and a fan cowl arranged surrounding this fan at the end-side of the motor, and flowing along the outer side of the motor on the peripheral side and thus hits the lower side of the frequency converter housing and the cooling ribs which are provided there.

This cooling principle, although having proven its worth, it is somewhat problematic with regard to the design, to suggest as compact as possible, design of the frequency converter, but on the other hand to select the cooling and arrangement of the components such that different heat zones are arranged, in accordance with the thermal load characteristics of the individual components. Thus for example, the electronic switches of the power circuit as a rule may withstand higher operating temperatures than the capacitors of the intermediate circuit, and these in turn may withstand higher temperatures than the control and regulation electronics.

BRIEF SUMMARY OF THE INVENTION

Against this background, it is the object of the invention to provide a frequency converter of the above mentioned type, which on the one hand is constructed in a compact manner, i.e. utilizes the space enclosed in the frequency converter housing as much as possible, but which on the other hand ensures an effective cooling, and this according to the thermal demands of the respective components/componentries.

The frequency converter according to the invention comprises a housing which is designed and envisaged for the peripheral assembly on an electric motor, and with which at least the base is designed in a heat-conducting manner. The base of the frequency converter housing is provided on the outside with longitudinal ribs in a middle region on its outer side, and specifically on the outer side facing the motor, and on the inside is connected in a heat-conducting manner to heat-producing components of the power circuit of the frequency converter. Moreover, the base in at least one outer region, arranged next to the middle region, comprises cooling ribs arranged on the outside transversely or obliquely to the longitudinal ribs, and in this region, on the inside, is connected with a non-positive fit and in a heat-conducting manner to heat-producing components of the input circuit and/or intermediate circuit of the frequency converter.

A particularly effective cooling arrangement which is favourable for the applied components, is achieved by way of this design according to the invention. Thereby, a longitudinal flow between the motor and the lower side of the housing of the frequency converter is formed along the longitudinal ribs, thus where the housing is arranged close to the motor, and this flow ensures an intensive cooling of the components of the power circuit, which are connected in this region on the inside to the base. This cooling flow is produced by the fan of the motor, on which the frequency converter is arranged. Moreover however, a convection cooling flow forms on account of the cooling ribs which are arranged in an external region transversely or obliquely to the longitudinal ribs, and this convection cooling flow, although having a lower flow speed than the longitudinal cooling airflow, given a suitable design of the transverse ribs or oblique ribs, is however sufficient to cool the components of the input circuit and/or intermediate circuit of the frequency converter, these components producing heat and according to the invention, being connected with a non-positive fit and in a heat-conducting manner to the housing in this region, on the inside. The arrangement is moreover such that in operation, in the outer region, a lower temperature level sets in than in the middle region, where the power electronics are arranged. It is therefore possible by way of the design according to the invention, to arrange the electronic components of the power circuit in the direct vicinity of the electrical/electronic components of the input circuit and/or intermediate circuit, without thermally overloading these.

According to a further formation of the invention, the outer contour of the frequency converter housing is curved on the lower side, corresponding to the outer contour of the electric motor. The outer contour of the electric motor may be curved by way of this. A free space which otherwise may not be used, may be utilized for the frequency converter way of this. A further advantage of this curved outer contour of the frequency converter on its lower side, i.e. its side facing the motor, is that apart from the middle region in which the power electronics are arranged, the outer regions of the housing base which are arranged next to this, lie deeper, which encourages the maintenance of a different thermal level within the frequency converter, in particular prevents the high temperatures prevailing in the power circuit from arising in these outer regions of the frequency converter housing. Moreover, space for bulky components such as coils and capacitors may be provided in the outer regions by way of this design of the housing.

In order to ensure an intensive cooling of the power circuit in the middle region, it is useful to design the cooling channels which extend between adjacent longitudinal ribs on the side of the frequency converter housing facing the motor and which are open towards the motor, in an uninterrupted manner, so that the cooling air flow, where possible, may flow from one to the other end in a longitudinal flow over the whole length of the frequency converter. For this, in particular, the cable lead-through which is required between the frequency converter housing and the motor housing and which regularly forms an interruption of the cooling channels, is to be located in a lateral or outer region. Thereby, the longitudinal ribs on the lower side of the frequency converter preferably extend over the whole length, in order there to lead a directed, preferably laminar flow which ensures a good heat removal in this region.

In order to provide an effective heat transition from a component producing heat, within the frequency converter housing, to the housing base and to the cooling rubs which are arranged there on the outside, heat connection surfaces are provided within the housing on the base side, and specifically in the middle region for heat-producing components of the power circuit, typically the electronic switches, and heat connection surfaces for heat-producing components of the input circuit and/or the intermediate circuit, in one, preferably in both outer regions. Such heat-producing components of the input circuit and intermediate circuit may be rectifiers, coils, capacitors or likewise and are connected with a non-positive fit and thus in a highly heat-conductive manner to the connection surfaces.

A good thermally conductive contact to the heat-producing components is created via these connection surfaces. Thereby, according to a further formation of the invention, it is particularly advantageous if the heat connection surfaces in the outer region or in the two outer regions are arranged at a different, in particular deeper level than in the middle region. By way of this, on the one hand a good spatial utilization of the inner space is achieved, and on the other hand the previously described different temperature levels within the frequency converter housing are encouraged.

The previously used terms relating to the spatial assignment such as upper, lower, deep high, along and transverse, relate to a common motor arrangement with which the motor is arranged with its middle longitudinal axis parallel to the ground, and the frequency converter is arranged on the side of the motor which is distant to the base, on the peripheral side of the motor.

According to the invention, capacitors and/or coils of the intermediate circuit are arranged and connected to the housing base in a heat-conducting manner in these outer regions of the frequency converter housing which advantageously lie deeper than the middle region. Thereby, the capacitors are advantageously arranged in a standing manner, since in this manner, on the one hand the topography of the housing base is utilised the most, and on the other hand a good thermal conduction arises due to the end-side coupling.

Further advantageously, heat-producing components of the input circuit may also be arranged in this outer region of the housing, for example an RFI-coil, which likewise require a comparatively large amount of installation space, and thus in this region may be installed in an almost ideal manner.

With the previously described topography of the frequency converter housing, and the arrangement of the components, these heat-producing components may be advantageously arranged on a circuit board which is arranged at a distance to the housing base in a manner such that the heat-producing components in each case have a heat connection surface facing the housing base, and are connected with a non-positive fit and thus in a highly heat-conducting manner to the associated heat connection surface by way of a coupling body. This arrangement thus has the great advantage that a multitude of heat-producing components may be electrically wired by way of a circuit board, thus individual wirings are largely done away with, and on the other hand these components are connected in a heat-conducting manner via suitable heat connection surfaces to the intensively cooled housing base. The components are thus installed hanging on the circuit board and are supported with a non-positive fit at their lower side by the heat connection surfaces. The weight thus acts in a supporting manner in the direction of the heat connection surfaces, which is likewise advantageous.

The previously described design according to the invention moreover permits the heat-producing components of the intermediate circuit as well as of the power circuit to be arranged in an advantageous manner on the same circuit board, which is particularly advantageous, since no cable connections are required between the intermediate circuit and the power circuit, which if they were designed as solder connections, are extensive and bulky and of a hindrance with maintenance and repair purposes, and if they are formed as plug connections, are prone to fretting corrosion on account of oscillation loading occurring in the housing during operation.

In order to compensate for manufacturing tolerances and thermally induced changes in dimensions of the components, without unallowably loading the circuit board, but on the other hand to ensure a good heat transmission between the components and the connection parts, according to the invention, coupling bodies are provided, which are advantageously designed such that they are electrically insulating, very heat-conducting and moreover elastic, in order to compensate the previously mentioned dimension changes and to be able to muster the required biasing force.

According to one advantageous formation of the invention, such a coupling body is constructed in a two-layered manner and comprises a first shape-stable layer and a second shape-compensating layer. The elastic layer thereby serves for adaptation and non-positive fit coupling to the component, whereas the shape-stable layer is provided and envisaged for thermal coupling onto the heat connection surface.

Thereby, it is particularly advantageous if the shape-stable layer has a grid structure. Layer thicknesses of this layer between 0.7 and 1.3 mm have been found to be advantageous. The elastic layer is to be dimensioned such that on the one hand the previously described tolerance compensation or thermally induced dimension compensation may be effected, and on the other hand that the layer is as thin as possible, in order to ensure a good heat transition. Advantageously, thus the elastic layer according to the invention has 2.5 to 3.5 times the thickness of the shape-stable layer, preferably a thickness between 5 and 6 mm. Moreover, the elastic layer is advantageously electrically insulating, so that the shape-stable layer which is comparatively thin in any case, may also be designed in an electrically conductive manner as the case may be.

The arrangement of the electronic/electrical components within the frequency converter, according to an advantageous further formation of the invention, is selected such that the leading of current within the housing, in particular in the region of the circuit board or circuit boards close to the base, is essentially circular, i.e. that the leading of current from the mains connection to the motor is effected firstly in the input circuit, then in the intermediate circuit and finally in the power circuit and from there to the lead-through to the motor.

BRIEF DESCRIPTION OF THE SEVERAL
VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown.

The invention is hereinafter described in more detail by way of one embodiment example represented in the drawing. There are shown in the drawings.

DETAILED DESCRIPTION OF THE INVENTION

Figure 1:
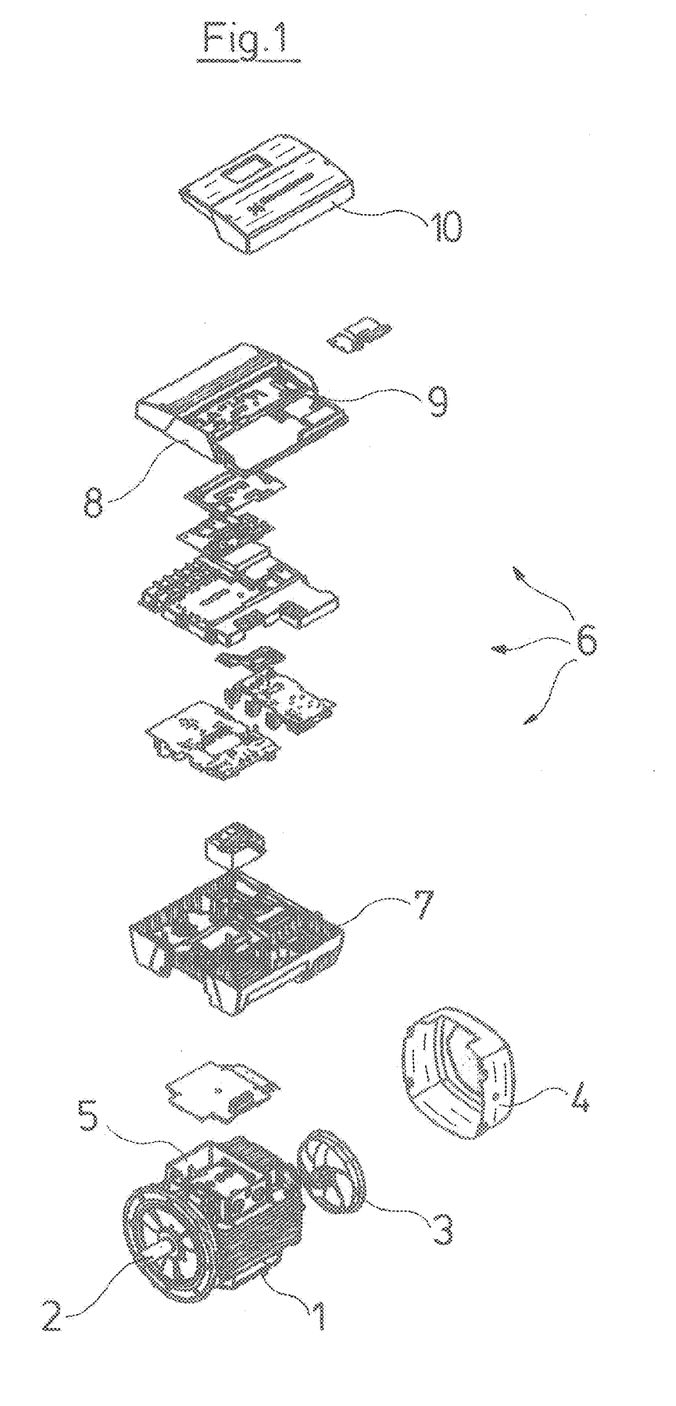
FIG. 1 is in a perspective exploded representation, an electric motor with a frequency converter.

The exploded representation according to FIG. 1 shows the complete construction of the assembly with an electric motor 1 with a drive shaft 2, whose rear-side end carries a fan 3 which is covered by a fan cowl 4, in order thus, on operation, to produce an air flow along the peripheral surface of the motor 1 which is provided with cooling ribs, parallel to the longitudinal axis. The upper side of the electric motor is provided with a box-like frame 5, which is provided for fastening a frequency converter 6 which has a lower housing part 7 which is fastened on the frame 5 and whose upper housing part is formed by a cover 8, which in turn has an upper opening 9 which may be closed by way of a cover cap 10. This opening 9 provides access to a type of terminal box. The electrical connections of the mains cable and those of the frequency converter are accessible through it when the cover cap 10 is removed.

The frequency converter housing consisting essentially of the lower housing part 7 and the upper housing part 8, is designed as a casting and consist of a highly heat-conducting, metallic material, here a lightweight metal alloy. The lower housing part 7 is fastened on the housing of the electric motor 1, which likewise consists of metal, and specifically on the frame 5, and specifically such that a free space remains between the upper side of the frame 5 which is covered by a plate and the lower side of the lower housing part 7, wherein a part air flow which is produced by the fan 3 and flows along the outer side of the motor, flows through this free space.

Figure 3:
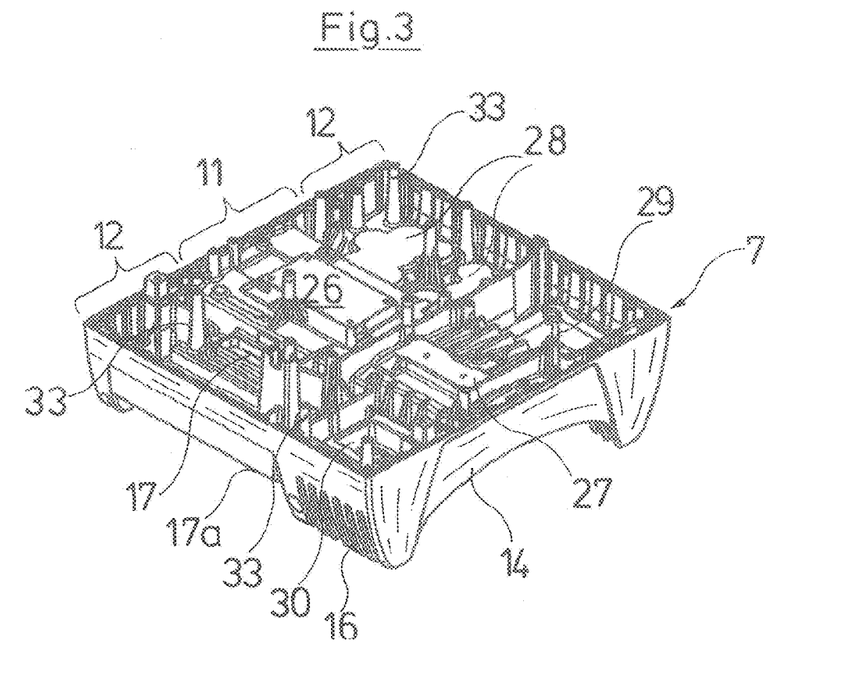
FIG. 3 is in a perspective representation, the lower part of a frequency converter housing seen obliquely from above.
Figure 4:
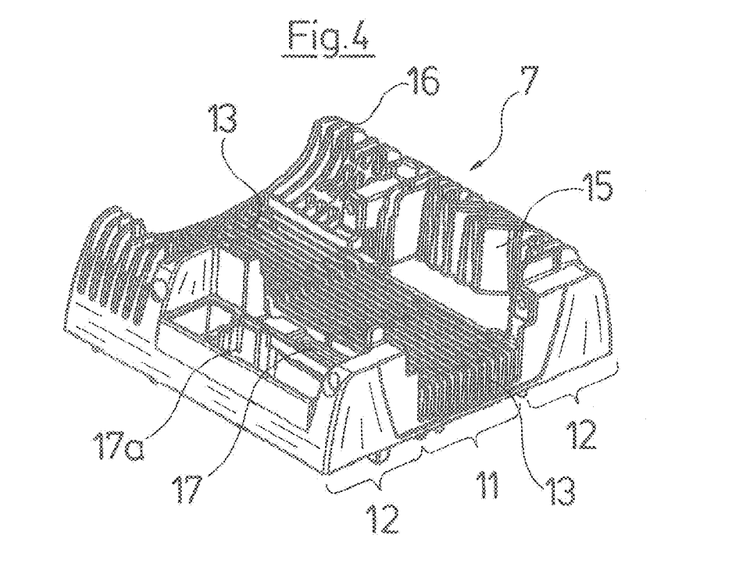
FIG. 4 is the lower frequency converter housing part according to FIG. 3, from the lower side.

As is particularly evident from the FIGS. 3 and 4, the lower housing part 7 is adapted to the essentially circular outer contour of the electric motor 1. The housing part 7 has a middle region 11, which on its lower side, i.e. on the side facing the motor in the assembled condition, is provided with longitudinal ribs 13 which continuously extend over the whole length of the housing part 7, and between which continuous cooling channels open to the bottom are formed for the part air flow produced by the fan 3 along the motor 1, which flows through this region. The longitudinal ribs 13 are delimited at their end which is downstream, by a transverse wall 14, which simultaneously forms the wall which terminates the frequency converter housing to the rear in the flow direction.

Two outer regions 12, in which the lower housing part 7, following the outer contour of the motor 2 in the installation position (FIG. 1), is laterally extended further downwards, are adjacent to the middle region 11. Cooling ribs are likewise arranged in this region 12, which however as with the cooling ribs 15, are arranged obliquely, or as with the cooling ribs 16, transversely to the longitudinal ribs 13 and laterally thereto. Moreover, the lower housing part 7 in the outer region comprises a longitudinal recess 17, parallel to the longitudinal ribs 13 and directly adjacent thereto, which is provided for leading through the electrical leads between the motor and the frequency converter. A further recess 17a is provided directly adjacent to this on the outside in the outer region 12, and this recess is provided for incorporating the lead-through of the electrical connection cable for the mains connection.

The shaping and ribbing of the lower housing part 7 which is particularly evident from FIG. 4 leads to the fact that with an onflow of the cooling air flow produced by the fan 4, a part air flow flowing through below the housing part 7 essentially in the longitudinal directions, is formed in the middle region, and this part air flow cools the middle region in a comparatively intensive manner. In contrast, a convection flow which is directed essentially transversely to this and which cools the outer region 12, is formed in the outer regions 12, wherein this flow has a lower speed and thus also a lower cooling effect.

The components producing heat are also arranged within the housing part 7 in accordance with this different cooling effect in the middle and in the outer region 11, 12.

Figure 2:
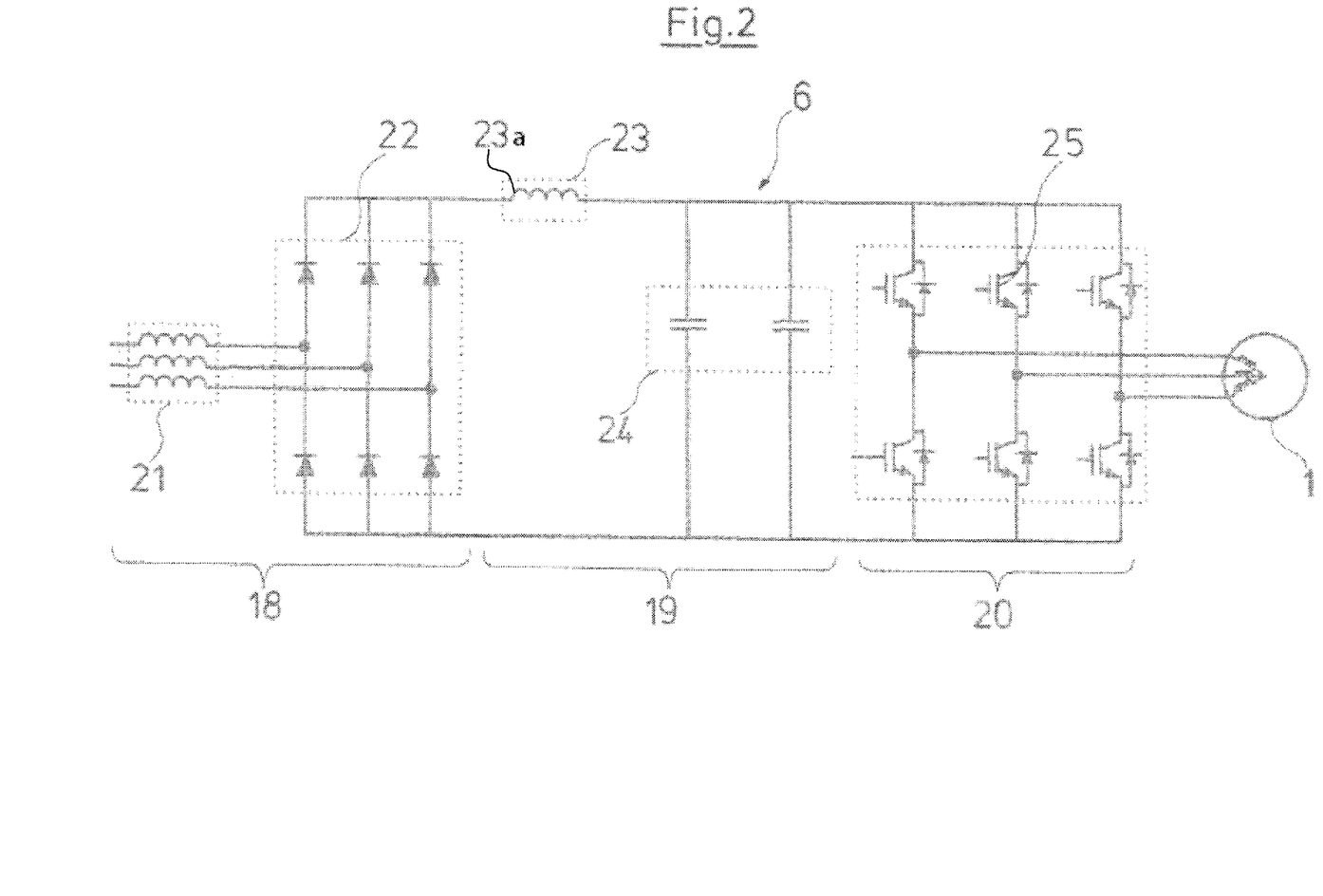
FIG. 2 is the basic electrical construction of a frequency converter in the form of a greatly simplified circuit diagram.

The heat-producing components of the frequency converter are evident from the circuit diagram according to FIG. 2. The frequency converter 6 comprises an input circuit 18, an intermediate circuit 19 and a power circuit 20. An RFI filter (high-frequency filter) is firstly provided in the input circuit in the form of an RFI-coil 21. The input circuit 18 furthermore comprises a rectifier 22, and the intermediate circuit 19 connecting thereto is represented in FIG. 2 by an inductance 23 and a capacitance 24, the power circuit 20 by electronic power switches and free-wheeling diodes. It is to be understood that apart from the electronic components represented in FIG. 2 in a symbolised manner, a multitude of further components is present, as is usual with the construction of such frequency converters. The control and regulation electronics which are necessary for the activation are also not shown in detail here.

Since most waste heat arises within the power circuit 20, this is to be cooled most intensively. For this reason therefore, a heat connection surface 26 is provided on the inner side of the lower housing part 7 where the most intensive cooling is effected, thus in the middle region 11 which is at the front seen in the onflow direction, and the power switches 25 of the power circuit 20 dissipate their heat via this surface.

Moreover, a heat connection surface 27 is provided in the middle region 11 but lying therebehind in the flow direction, which is provided for the removal of the heat occurring in the rectifier 22.

Heat connection surfaces 28 are provided in the outer regions 12, for the capacitance 24 of the intermediate circuit 19, thus to the connection of the capacitors. Moreover, a heat connection surface 29 is provided for the intermediate circuit inductance 23, thus for a coil 23a. A heat connection surface 30 for the RFI-coil 21 is provided in the outer region 12 on the other side.

Figure 7:
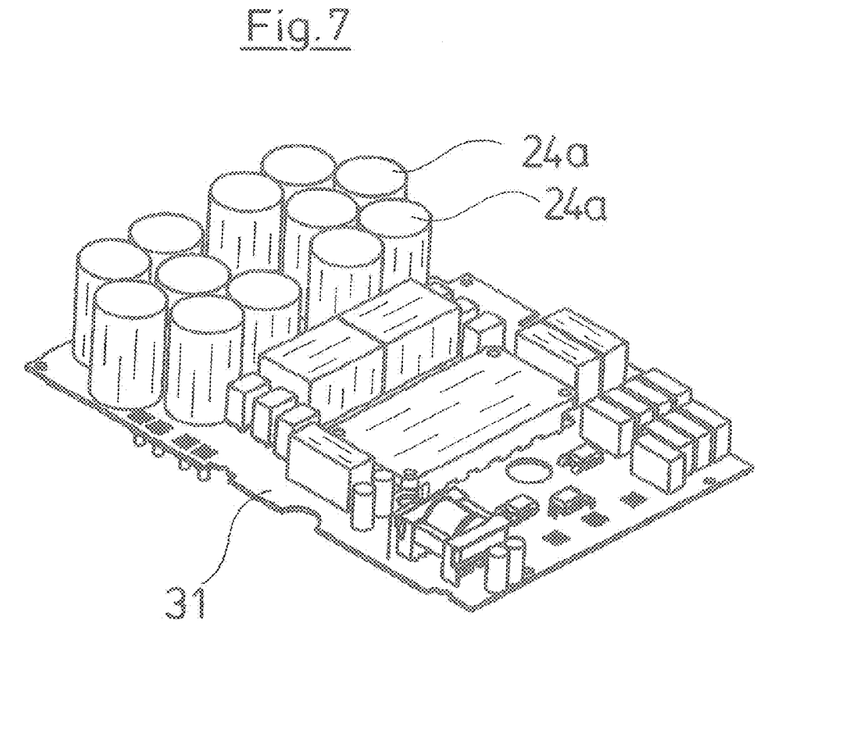
FIG. 7 is a greatly simplified perspective view of a circuit board which carries the components of the intermediate circuit and the power circuit.
Figure 8:
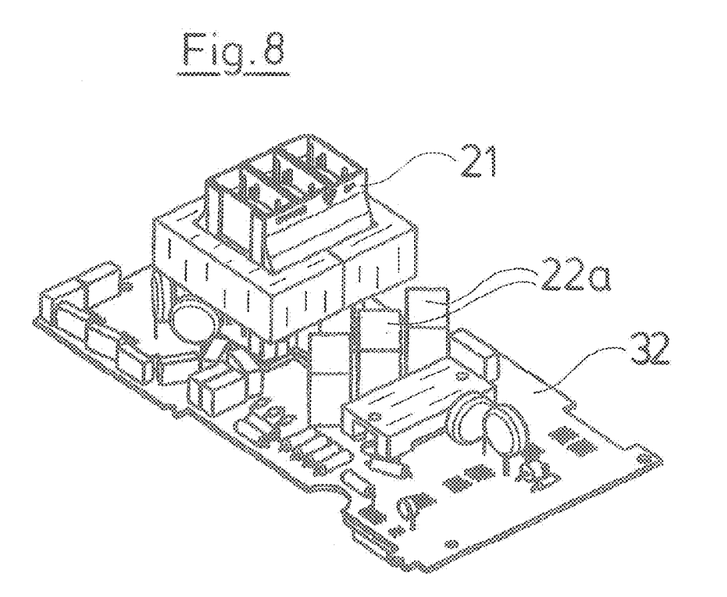
FIG. 8 is a perspective view of a circuit board which carries the components of the input circuit.

The previously mentioned components, with the exception of the coil 23a of the intermediate circuit 19, are arranged on two circuit boards 31 and 32. The circuit board 31 comprises the heat-producing components 25 of the power circuit 20 which are arranged in the middle region, as well as further components of the power circuit 20. Components of the intermediate circuit 19 are arranged in the outer region, and the capacitors 24a which form the capacitance 24 are clearly visible. The construction and equipping of the circuit boards is to be deduced in detail in FIGS. 7 and 8. The circuit board 32 carries the components forming the rectifier 22, in particular the diodes 22a as well as the RFI-coil 21.

The circuit boards 31 and 32 are essentially arranged in a housing plane forming the partition plane of the frequency converter, and specifically such that the previously described electronic components are arranged hanging downwards, thus facing in the direction of the base of the housing part 7. For this, supports 33 are provided within the lower housing components, on which the circuit boards 31, 32 lie, and in which these are firmly connected to the housing 7 by way of screws. The heat-producing components thereby are in each case connected with a non-positive fit to the associated heat connection surfaces 26 to 30 of the housing part 7, via in each case an initially described coupling body which is not represented in the drawings. These coupling bodies are plate-like and have an essentially shape-stable, thin layer with which they bear on the heat connection surface, as well as an elastic and likewise thermally conductive but electrically insulating thicker layer, which is provided for the compensation of manufacturing tolerances and thermal expansion, and which fills out the free space between the downwardly directed thermal connection surfaces of the electrical/electronic components, and the heat connection surfaces 26 to 30. This elastic layer is biased in the assembled condition and thus forms the non-positive fit between the heat connection surface and the component, for conducting heat.

Figure 5:
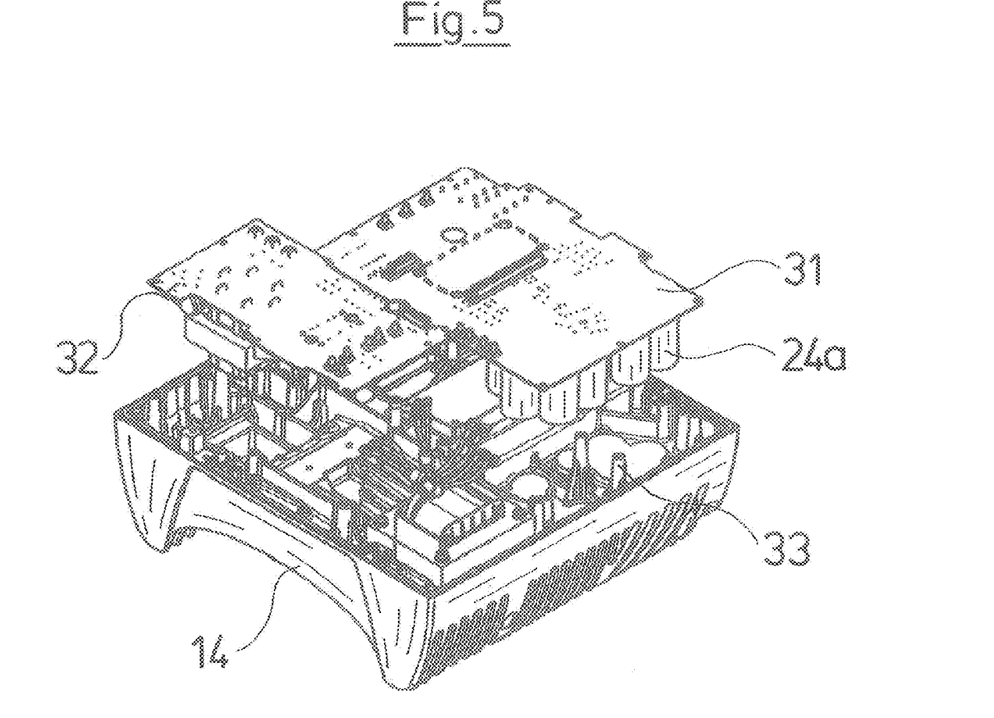
FIG. 5 is in a perspective representation, the lower frequency converter housing part in a preassembly position.
Figure 6:
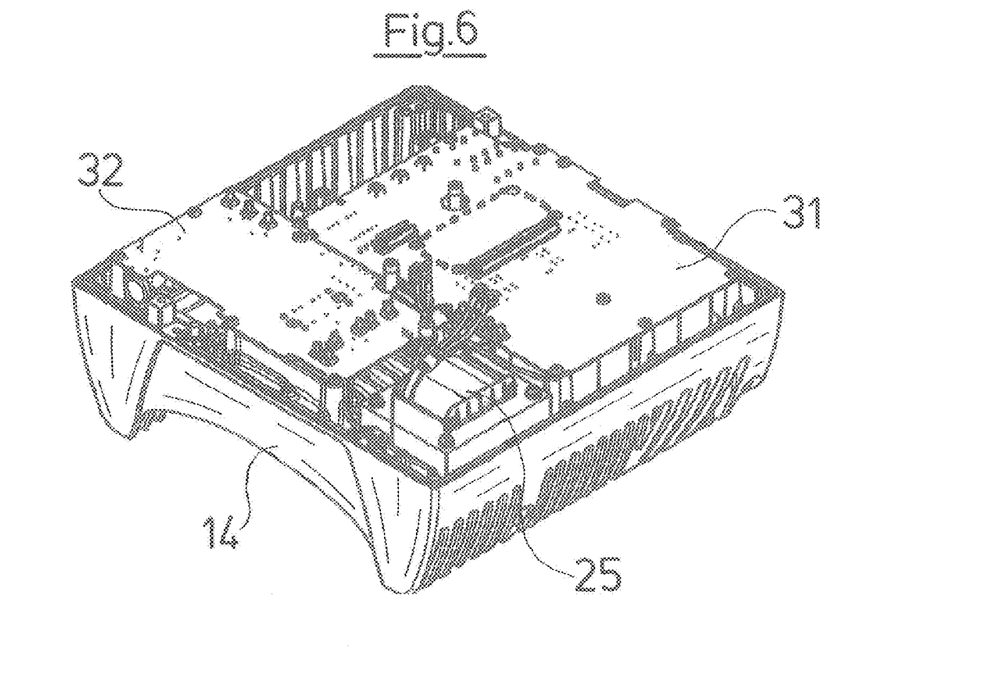
FIG. 6 is in a representation according to FIG. 5, in the assembled condition.

As is particularly made clear in FIGS. 3 and 5, the heat connection surfaces 26 and 27 in the intensively cooled middle region 11 are arranged at a higher level than the heat connection surfaces 28 to 30 in the outer regions. By way of this, on the one hand, one takes into account the construction sizes of the respective components, and on the other hand the thermal characteristics of these components. Thus the outer regions 12 and the components arrangement therein are loaded thermally to a lesser extent that the components arranged in the middle region 11, where however a greater heat removal is effected by way of the more intensive cooling air flow. Only the circuit boards and components, which for example comprise the control and regulation circuit, and in FIG. 1 are arranged visibly above the circuit boards 31 and 32, are loaded thermally the least.

As may be recognised by way of FIGS. 3 and 5, the leading of current within the frequency converter 6 is effected essentially in a circular manner. The current firstly flows from the electrical mains connections into the RFI-coil 21 which is seated on the circuit board 32, and is provided in the outer region 12 (at the front in FIG. 3) for the connection to the heat connection surface 30. From there it goes into the rectifier 22, which is likewise seated on the circuit board 32 and whose heat is led away via the heat connection surface 27. From there, the leading of the current is to the intermediate circuit 19, and the respective heat connection surfaces 29 for the coil 23a and 28 for the capacitors 24a are arranged in the outer region 12 (right to the front and rear in FIG. 4). From there, the leading of current is directed to the power circuit 20, and the respective components 25 are cooled via the heat transfer surface 26 in the middle region, from where the subjection of the stator of the electric motor 1 to current is effected above the recess 17.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

We claim:

1. A frequency converter with a housing which is designed and envisaged for peripheral assembly on an electric motor, and whose base is designed in a heat-conducting manner and, in a middle region, is provided with longitudinal ribs on an outside, and on an inside is connected to heat-producing components of a power circuit of the frequency converter in a heat-conducting manner, wherein the base in at least one outer region comprises cooling ribs arranged on the outside transversely or obliquely to the longitudinal ribs, and on the inside comprises heat-producing components of an input circuit or an intermediate circuit or the input circuit and the intermediate circuit of the frequency converter, which are connected with a non-positive fit in heat-conducting manner to said base.

2. A frequency converter according to claim 1, characterized in that an outer contour of the housing on a lower side is designed curved corresponding to the outer contour of the electric motor.

3. A frequency converter according to claim 1, characterized in that uninterrupted cooling air channels which are open towards the motor and extend in a longitudinal direction are formed between adjacent said longitudinal ribs on the outside of the housing which faces the motor, wherein said longitudinal ribs extend over a length of the housing.

4. A frequency converter according to claim 1, characterized in that the base in the middle region comprises at least one heat connection surface for the heat-producing components of the power circuit, and in said outer region comprises at least one heat connection surface for the heat-producing components of the input circuit or the intermediate circuit or the input circuit and the intermediate circuit, and that the heat connection surfaces in the outer region are arranged at a different, in particular, a deeper level than in the middle region.

5. A frequency converter according to claim 1, characterized in that one or more capacitors or coils or capacitors and coils of the intermediate circuit are arranged and connected to the housing base in a heat-conducting manner, in the outer region of the housing.

6. A frequency converter according to claim 1, characterized in that an RFI-coil of the input circuit is arranged and connected to the housing base in a heat-conducting manner, in the outer region of the housing.

7. A frequency converter according to claim 1, characterized in that the heat-producing components of the input circuit or the intermediate circuit or the input circuit and the intermediate circuit are arranged on a circuit board, which is arranged at a distance to the housing base in a manner such that each heat producing component comprises a heat connection surface facing the housing base and is connected in a non-positive fit in a heat-conducting manner to an associated heat connection surface of the base by way of a coupling body.

8. A frequency converter according to claim 1, characterized in that the heat-producing components of the intermediate circuit and of the power circuit are arranged on a same circuit board.

9. A frequency converter according to claim 1, further comprising coupling bodies designed in an electrically insulating, heat-conducting and elastic manner.

10. A frequency converter according to claim 1, further comprising a coupling body constructed in a two-layered manner, and comprising a first shape-stable layer and a second shape-compensating elastic layer.

11. A frequency converter according to claim 1, further comprising a shape-stable layer having a grid structure and preferably a thickness of 0.7 to 1.3 mm.

12. A frequency converter according to claim 1, further comprising an elastic layer is electrically insulating elastic layer 2.5 times to 3.5 times the thickness of the shape-stable layer or a thickness between 5 and 6 mm.

13. A frequency converter according to claim 1, characterized in that an arrangement of the heat producing components of the input circuit, intermediate circuit and power circuit is such that a leading of current in the housing is essentially circular.

* * * * *